United States Patent [19]

Larsen et al.

[11] Patent Number: 5,375,224
[45] Date of Patent: Dec. 20, 1994

[54] RAW DATA READER

[75] Inventors: Keith J. Larsen, Newport Beach; Raymond W. Hall, Riverside, both of Calif.

[73] Assignee: Archive Corporation, Costa Mesa, Calif.

[21] Appl. No.: 116,047

[22] Filed: Sep. 2, 1993

Related U.S. Application Data

[63] Continuation of Ser. No. 590,229, Sep. 28, 1990, abandoned.

[51] Int. Cl.$^5$ ............ G06F 11/00; G06F 12/00; G06F 13/00
[52] U.S. Cl. ............ 395/500; 395/325; 395/400; 364/239.2; 364/239.3; 364/248.1; 364/251; 364/260; 364/265; 364/DIG. 1
[58] Field of Search ............ 395/325, 400, 500

[56] References Cited

U.S. PATENT DOCUMENTS

| | | | |
|---|---|---|---|
| 4,509,118 | 4/1985 | Shenk | 395/775 |
| 4,811,280 | 3/1989 | Berkowitz et al. | 395/425 |
| 5,056,010 | 10/1991 | Huang | 395/425 |
| 5,109,500 | 4/1992 | Iseki et al. | 395/425 |
| 5,151,999 | 9/1992 | Marzucco et al. | 395/250 |

FOREIGN PATENT DOCUMENTS 57-57355  4/1982  Japan .

*Primary Examiner*—Parshotam S. Lall
*Assistant Examiner*—Ayni Mohamed
*Attorney, Agent, or Firm*—Fliesler, Dubb, Meyer & Lovejoy

[57] ABSTRACT

A raw data reader for reading a magnetic medium computer storage device wherein data is stored as binary bits, including a data conditioner responsive to the computer storage device for providing serial binary data representative of the binary data read from the magnetic medium and corresponding thereto on a one-to-one basis, a serial to parallel converter for providing parallel data that includes formatting control information contained in the serial binary data, a decoder for decoding the parallel data, and control circuitry responsive to the serial binary data and the formatting control information for transferring selected decoded data to the host computer.

15 Claims, 2 Drawing Sheets

RAW DATA READER

This application is a continuation of U.S. patent application Ser. No. 07/590,229, filed Sep. 28, 1990, now abandoned.

The present invention relates generally to magnetic storage of binary information, more particularly to magnetic storage devices for computer application, and more specifically to a method and apparatus for reading raw binary data from magnetic media.

Magnetic medium computer data storage devices such as tape drives and disk drives generally provide data to a host computer via some type of high level interface which provides error checking of data read from the magnetic storage medium and which removes formatting information from the data prior to transfer to the host computer. If an uncorrectable error occurs in the data read from the magnetic, reading stops and an error message is transmitted to the host computer. As a result of an uncorrectable error, varying amounts of data on the magnetic medium cannot be retrieved or examined via the high level interface.

A further consideration with magnetic medium storage devices is the inability to examine, via a higher level interface, formatting information to check for compliance with formatting specifications or to check for errors.

SUMMARY OF THE INVENTION

It would therefore be an advantage to provide for a magnetic medium storage device reader that provides for reading and output of the raw data as recorded on the magnetic medium.

Another advantage would be to provide a magnetic medium storage device reader that provides a raw data output that represents the data recorded on the magnetic medium in a readily analyzed form.

The foregoing and other advantages are provided by the invention in a raw data reader that operates in conjunction with a host computer for reading the serial binary data stored in a magnetic medium computer storage device which provides outputs including a serial data output that corresponds to the stored binary data on a one-to-one basis and a data clock for identifying the bits in the serial data output. The raw data reader includes circuitry for detecting the data grouping boundaries of the serial data output (nibble boundaries, for example), circuitry for decoding the grouped data, and circuitry for transferring the decoded data to the host computer.

BRIEF DESCRIPTION OF THE DRAWINGS

The advantages and features of the disclosed invention will readily be appreciated by persons skilled in the art from the following detailed description when read in conjunction with the drawing wherein.

DETAILED DESCRIPTION OF THE DISCLOSURE

Figure 1:
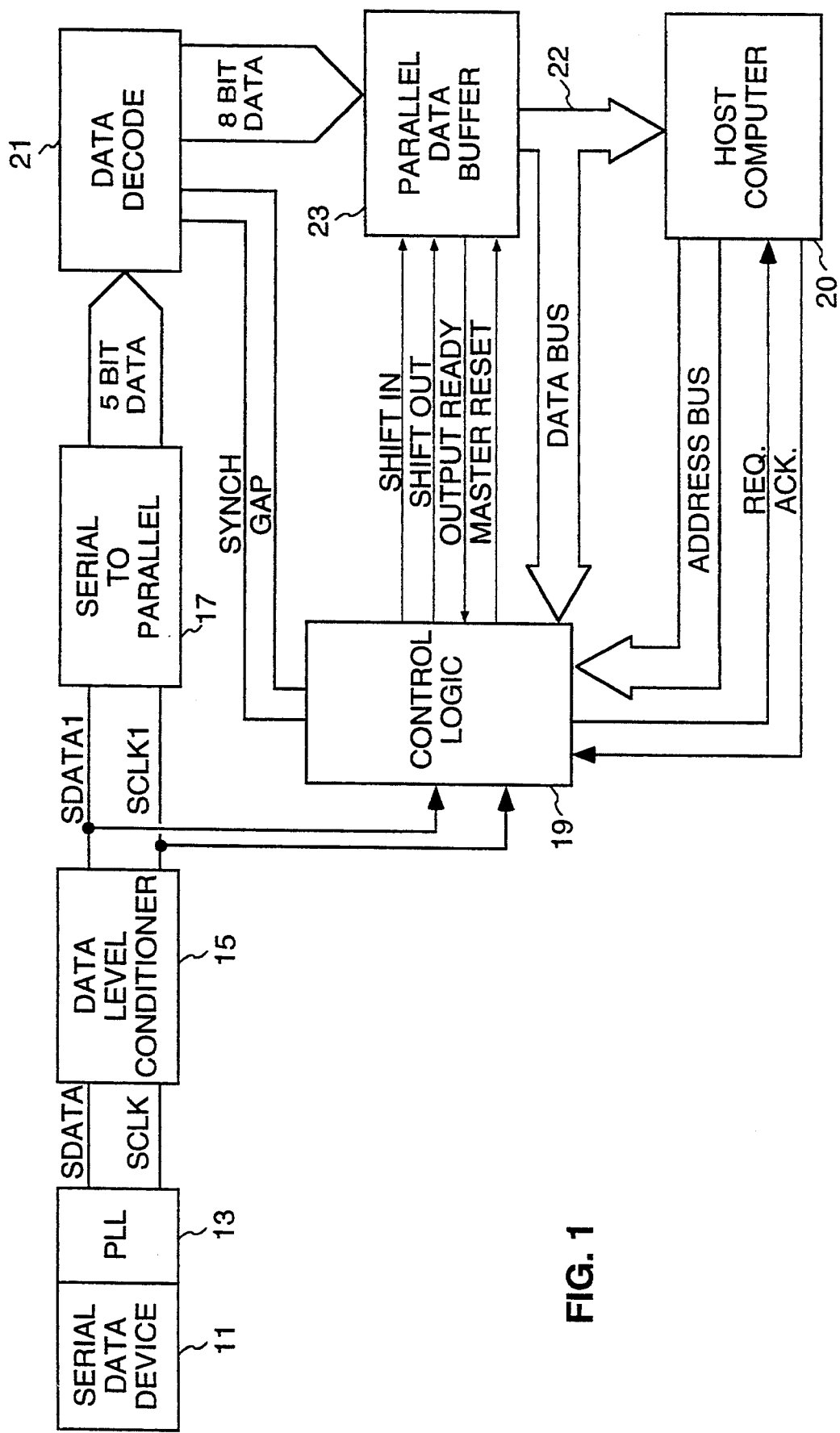
FIG. 1 is a block diagram of an illustrative implementation of a raw data reader in accordance with the invention.

In the following detailed description and in the several figures of the drawing, like elements are identified with like reference numerals.

Referring now to FIG. 1, shown therein is a block diagram is an implementation of a raw data reader in accordance with the invention. By way of illustrative example, the raw data reader of FIG. 1 is discussed herein generally in the context of use with a magnetic tape drive. A host computer 20 having a DMA controller and a memory controls the operation of the raw data reader pursuant to execution of an application program. The data read from the magnetic medium and stored in the host computer memory can then be displayed, printed, and/or stored in a file for review and analysis.

As is well known, information recorded on magnetic media such as magnetic tape of magnetic disk essentially comprises a serial bit stream (i.e., a series of bits) that makes sense only after the organization thereof is known. Typically, such organization is conveyed by uniquely identifiable formatting information included in the recorded serial bit stream.

The disclosed raw data reader reads the recorded serial bit stream and decodes the formatting information to the extent necessary to organize the output in manner that is readily analyzed. While the output is not displayed in terms of 1's and 0's, the decoded data represents what is actually written on the magnetic medium and can be transformed, if necessary, into 1's and 0's that correspond on a one-to-one basis to what was read from the magnetic medium.

For the disclosed illustrative implementation of a raw data reader for a tape drive, the data written to tape has been run-length limited (0,2) coded and written in NRZI code wherein a "1" causes aflux reversal while a "0" does not. Pursuant to run length limited coding, a 4-bit nibble (i.e., one-half of a byte) is converted to a 5-bit encoded nibble For user data, each byte is separated into two 4-bit nibbles which are then encoded into two 5-bit nibbles. Since user data will not use all of the available 5-bit codes, some of the remaining 5-bit codes are used for formatting information such as "gap" and "synch" marks which are uniquely identifiable nibbles.

The data stored by the raw data reader comprises 8-bit bytes, each of which has been decoded from a corresponding 5-bit nibble in accordance with industry standard. Pursuant to such decoding, the 8-bit bytes containing formatting information can be differentiated from user data. In particular, a decoded byte that contains user data includes 0's in the four (4) highest order bits. The four (4) lower order bits of a decoded byte that contains user data comprise four (4) bits of a user data byte. Thus, the decoding provided with the invention does not restore user data, but rather provides an understandable representation of the data on the magnetic medium which takes nibble boundaries into account, rather than just a series of 1's and 0's. Essentially, the raw data reader provides a representation of a bit-map of a portion of the contents of the magnetic medium, and such representation can be transformed to the bit map.

Serial data SDATA and an associated serial data clock SCLK are provided by the phase locked loop 13 of a serial magnetic data storage device 11 which comprises a tape drive or a disk drive, for example. Connections to the phase locked outputs can be made by appropriate jumper or solder connections as appropriate.

The serial data SDATA can be transition coded data wherein a 1 is represented by a transition in level occurring during a bit interval and a 0 is represented by no transition in a bit interval. A data level conditioner 15 is provided to transform the transition coded data to serial data SDATA1 wherein two different levels (e.g., high and low) represent the two binary states of 1 and 0. The data level conditioner further provides a serial clock SCLK1 which synchronized with the serial data SDATA1 and can comprise the serial clock SCLK. The serial data SDATA1 comprises a one-to-one representation of the binary data that has been read from the magnetic storage medium of the storage device 11.

The serial data SDATA1 and the clock signal SCLK1 are provided to a serial-to-parallel (S/P) converter 17 and a control logic 19. The S/P converter is clocked by the serial clock signal SCLK1 and provides 5-bit parallel data pursuant which includes valid data nibbles at every fifth occurrence of the clock signal SCLK1. The 5-bit parallel data outputs of the S/P converter 17 are decoded in accordance with industry standard by a data decoder 21 to provide an output comprising 8-bit parallel data words. By way of illustrative example, the data decoder 21 comprises a read-only memory (ROM) and the 5-bit parallel data outputs are utilized as addresses to output 8-bit words stored in the ROM. The data decoder 21 provides an output for each of the 5-bit parallel data outputs of the S/P converter 17, and thus provides outputs that include valid data that correspond to valid data nibbles as well as invalid data. As discussed further herein, only the valid data outputs of the decoder are sampled so as to preserve the data nibble boundaries.

The valid data outputs of the data decoder 21 represent the decoded raw data read from tape which, as discussed above, includes format information as well as 4-bit nibbles of user data. The 8-bit output of the data decoder 21 is connected to the input of a first-in first-out (FIFO) parallel data buffer 23 which is controlled by the control logic 19. The output of the FIFO buffer 23 is connected to the data bus 22 of the host computer 20.

The data decoder 21 further provides SYNCH and GAP signals to the control logic 19. The SYNCH signal indicates the presence of a synch mark byte at the output of the data decoder, and the GAP signal indicates the presence of a gap mark byte at the output of the decoder 21. Each occurrence of a sequence having four gaps followed by a synch mark provides synchronization information as to the nibble boundaries of the serial data SDATA1.

In particular, the control logic 19 synchronizes the raw data reader pursuant to industry standard that specifies that a data block on tape is preceded by a number of gap marks and a synch mark. The number of gap marks at the beginning of the tape is typically greater than the number of gap marks between data blocks; and the appropriate number of gap marks is typically specified as a range (i.e., a minimum and a maximum). The 5-bit nibble immediately following a synch mark is the first 5-bit nibble of a data block. At the end of the data block are a predetermined number of nibbles containing a block address that is followed by a predetermined number of nibbles containing a cyclic redundancy check (CRC). Gap marks follow the CRC. By way of illustrative example, the logic becomes synchronized pursuant to the first occurrence of the predetermined sequence comprising 4 gap marks followed by a synch mark.

The control logic 19 controls the operation of the FIFO buffer 23 via MASTER RESET, SHIFT IN, SHIFT OUT, and MASTER RESET signals, while the FIFO buffer 23 notifies the control logic of its status via an OUTPUT READY signal. In particular, the control logic 19 clears and enables the FIFO buffer 23 with the MASTER RESET SIGNAL. For example, the MASTER RESET signal is controlled to be at a first state to clear the FIFO, and is set to a second state to enable the FIFO. When the FIFO buffer is enabled, the SHIFT IN signal is effective to cause the data at the input to the FIFO buffer to be shifted in. The SHIFT IN signal occurs after every 5 cycles of the serial clock SCLK1, since 5 cycles of the serial clock SCLK are needed to convert each nibble to a 5-bit parallel nibble, and is synchronized to the nibble boundaries. Thus, when the logic is synchronized and while the FIFO buffer is enabled, SHIFT IN causes the shifting in of 8-bit bytes that are decoded versions of the 5-bit nibbles in the serial data stream SDATA1.

The FIFO buffer 23 indicates to the control logic via the OUTPUT READY signal that data at the FIFO buffer output is valid. In response to the OUTPUT READY signal, the control logic 19 makes a DMA request to the host computer 23 via an REQ signal. When the requested transfer can be made, the host computer acknowledges the request via an acknowledgement signal ACK and transfers the data to the appropriate memory location determined by the DMA controller pursuant to the DMA setup. In response to the acknowledgement signal ACK, the control logic 19 provides a SHIFT OUT signal to the FIFO buffer 23 which causes the FIFO buffer 23 to replace the data currently in its output with the next 8-bit byte in sequence.

In this manner, the control logic 19 makes a DMA request every time data is ready at the output of the FIFO buffer 23, and the host computer makes the transfer when it is able. Depending upon the host computer capabilities, at most several bytes will be in the FIFO buffer 23 at any given time.

By way of illustrative example, data is transferred to the host computer memory until a designated number of bytes have been transferred. The total number of bytes transferred is limited by the size of the host memory and is controlled the applications program by appropriate control of the DMA controller of the host computer.

The FIFO buffer can be enabled after the first occurrence of the predetermined gap/synch sequence during a particular read operation, and the control logic is controlled by the applications software to operate in one of the start modes for which it is configured. By way of illustrative example, for an implementation wherein reading of the tape by the raw data reader always starts at the beginning of the tape, the control logic is configured so that the transfer data can start with (a) the first nibble that follows the predetermined sequence comprising 4 gap marks followed by a synch mark, (b) the first gap mark after a specified data block, or (c) the first nibble after a match for a specified search string.

In such implementation, the FIFO buffer would be cleared in response to a signal from the application program, and would then be enabled to shift in data starting with the first nibble that follows the first occurrence of the predetermined gap/synch sequence, or a match for a specified block address or search string, as appropriate. For a specified block address, the starting data can be the first gap following the matching block address and the cyclic redundancy Check (CRC) that follows the block address, wherein the CRC can be used to validate the detection of a block address.

As a further illustrative example, the raw data reader can be implemented for the capability of starting the tape at any tape position. In this case, the FIFO buffer would be enabled only after synchronization pursuant to detection of the predetermined sequence of 4 gap marks followed by a synch mark, and the start modes for the start of data transfer would be similar to those discussed above.

The data that is transferred to the memory of the host computer 20 begins with the first decoded byte of the specified starting data block or the data block following the location of a match to the search string, and continues with every decoded byte up to the limit specified for the DMA transfers. Thus, the data transferred to memory includes control information as well as user data, and for ease of analysis, the stored data can be displayed, printed, or stored in a file with the control information depicted in predetermined characters. For example, a gap mark byte can be displayed or printed as a "g" while a synch mark can be displayed or printed as an "S", for ease of identification.

Figure 2:
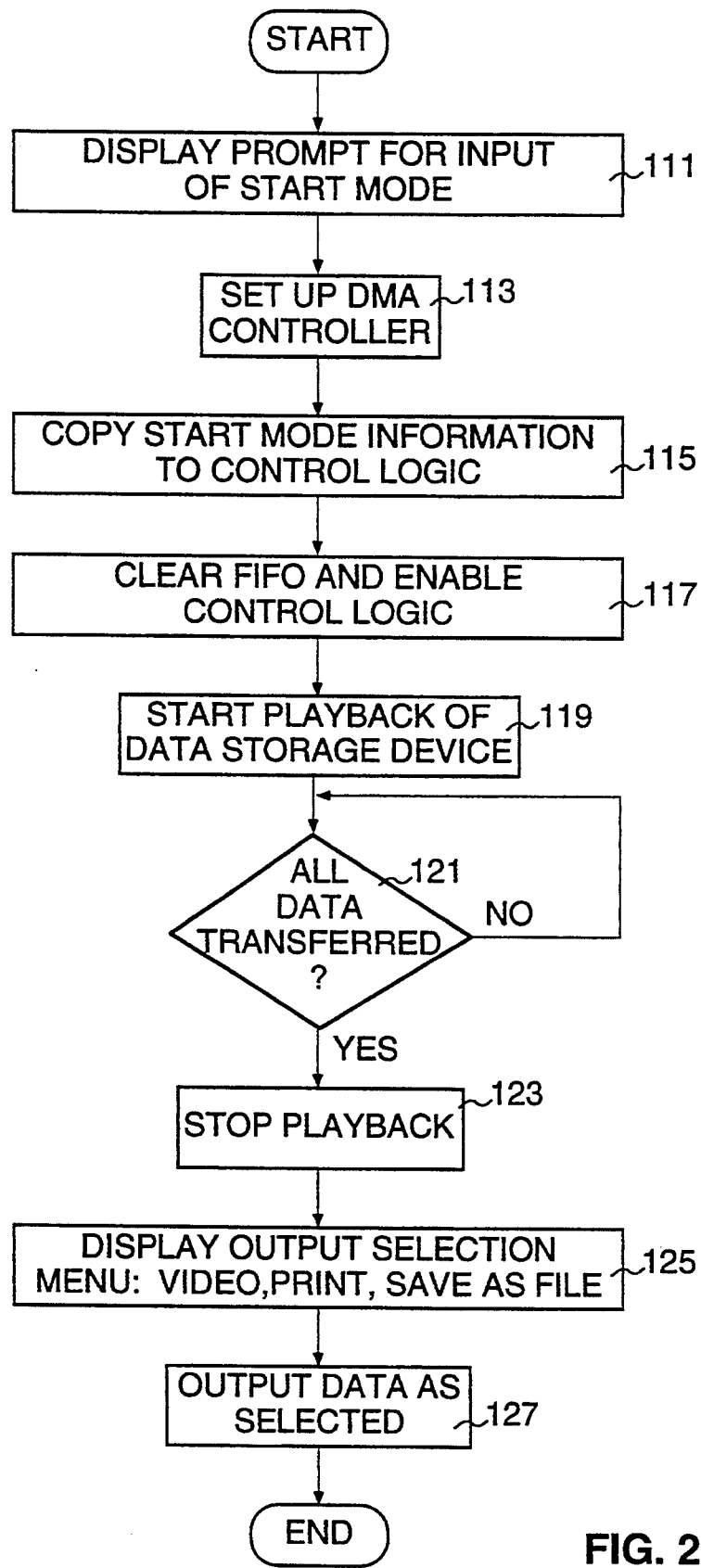
FIG. 2 is a flow chart of program procedures of the raw data reader of FIG. 1.

Referring now to FIG. 2, set forth therein is an illustrative example of procedures provided by an application program for controlling the control logic 19 for reading raw data from the storage device medium and for controlling the output of the raw data stored in the host computer memory.

At 111 a message is displayed, for example on a video display, to prompt the user to specify the desired start mode of operation and any appropriate block address or character string. It should be noted that input block address can be the desired block address decremented by 1, in view of the industry standard whereby the block address for a data block appears at the end of the block, or the application software can be configured to decrement the block address entered by the user. The display could also call for input of the number of decoded bytes to be transferred, or that number can be fixed in the application program.

At 113 the host DMA controller is set up, and at 115 the start mode information is communicated to the control logic together with the appropriate block address or search string. At 117, the FIFO buffer 23 is cleared, for example by non-data write to a predetermined address that is decoded by the control logic 19.

At 119, a playback command is provided to the data storage drive via a serial port of the host computer that is connected to a low level interface of the tape drive such as an RS232 interface that is commonly installed for diagnostic purposes. Alternatively, the application program could be configured to provide a message is displayed to prompt the user to provide a playback command to the drive, for example via the low level interface.

After the drive commences playback, the control logic synchronizes SHIFT IN to the first occurrence of the predetermined sequence of 4 gap marks followed by a synch mark. The FIFO is subsequently enabled to shift in data as appropriate to the selected start mode. As indicated above, such enablement can occur pursuant to detection of the predetermined gap/synch sequence, or detection of a match for a specified block address or a specified search string.

While the drive is in the playback mode, the application program waits for completion of the transfer of the designated number of decoded raw data bytes to the host computer memory. More particularly, a determination is made at 121 as to whether the designated number of bytes have been transferred. If no, the determination is repeated.

If the determination at 121 is yes, the designated number of bytes have been transferred, at 123 the drive is commanded to stop playback. For the alternative wherein the user externally controls the drive, a message would be displayed to prompt the user to stop playback.

At 123 a menu is displayed to inform the user of possible output selections that would include video output, printer output, or output to file. At 125 the selected output is provided, and the process ends. As discussed above, the data output of the raw data can include symbols that represent formatting information, which can be provided by the application program (i.e., the application program decodes the decoded bytes to provide the symbols).

The above disclosed raw data reader comprises an architecture for synchronization of serial data to data boundaries (e.g., nibbles), detection of formatting information, decoding of the data as appropriate, and transfer to decoded data to the host computer. For implementations for use with other serial magnetic storage devices such as disk drives, the same architecture applies with appropriate configuration of the serial to parallel converter, the data decoder, the control logic and the applications program for the data grouping (e.g., nibbles) and formatting utilized.

The foregoing has been a disclosure of a raw data reader that advantageously reads raw data from the magnetic medium of a magnetic storage device which represents each binary bit of information read from tape, and outputs the raw data in a form that is easily analyzed and which can be converted if necessary to an bit map of the contents of the portion of the magnetic media that resulted in the stored data. A raw data reader in accordance with the invention is advantageously implemented with a circuit board configured for installation in an expansion slot of microprocessor based computers, a cable for connecting the host serial port to the storage device, and a cable for connection between the circuit board and the phase locked loop outputs of the storage device.

Although the foregoing has been a description and illustration of specific embodiments of the invention, various modifications and changes thereto can be made by persons skilled in the art without departing from the scope and spirit of the invention as defined by the following claims.

What is claimed is:

1. An apparatus for transferring binary bits output by a magnetic storage device pursuant to serial reading of a series of recorded binary bits contained in a magnetic medium of the storage device, wherein the series of recorded binary bits includes user information and formatting information, and wherein the binary bits output by the magnetic storage device correspond on a one-to-one basis with the series of recorded bits read from the magnetic medium, the apparatus comprising:

serial means responsive to the binary bits output by the magnetic storage device for producing a serial bit-stream of binary data representative of each binary bit read from and output by the magnetic storage device;

conversion means for converting the serial bit-stream of binary data to a parallel data signal representative of each recorded binary bit read from and output by the magnetic storage device;

decoding means for decoding said parallel data signal to produce therefrom decoded parallel data that is representative of each binary bit read from and output by the magnetic storage device, the decoding means including distinguishing means for distinguishing unique formatting sequences from other bit sequences found within the parallel data signal and for producing position indicating signals indicating the position within the serial bit-stream of the unique formatting sequences, and for including within the produced decoded parallel data, distinguishing indicia distinguishing formatting information from user information; and control and transfer means responsive to said position indicating signals for identifying boundaries of predetermined groupings of bits in the serial bit-stream of binary data and for transferring to a host computer corresponding samples of the decoded parallel data corresponding to said predetermined groupings, said transferred samples of the decoded parallel data signal being representative of each binary bit read from and output by the magnetic storage device so as to include and distinguish the user information and the formatting information contained in the series of binary bits read from and output by the magnetic storage device.

2. The apparatus of claim 1 wherein said control and transfer means includes:

boundary detecting means for detecting the occurrences of one or more predetermined sequences of formatting information indicative of a predefined boundary of said predetermined grouping of bits; and transfer initiating means, operatively coupled to the boundary detecting means, for initiating said transfer of the corresponding samples of the decoded parallel data to the host computer upon detection of one of said predetermined sequences of formatting information.

3. The apparatus of claim 2 wherein said boundary detecting means includes means for detecting a plurality of gap marks followed by a synch mark, said sequence of formatting information being indicative of the start of a block of user data to be transferred to the host computer and wherein said transfer initiating means responsively initiates said transfer of the corresponding samples of the decoded parallel data to the host computer upon detection of the plurality of gap marks followed by a synch mark.

4. An apparatus for transferring a serial bit-stream of binary bits output by a serial storage device pursuant to serial reading of a series of recorded binary bits contained in a storage medium of the serial storage device, wherein the series of recorded binary bits includes formatting information and user information, the apparatus comprising:

conversion means for converting the serial bit-stream of binary bits output by the storage device to a parallel data signal representative of each recorded binary bit read from and output by the storage device;

decoding means, operatively coupled to the conversion means, for decoding said parallel data signal and producing therefrom a decoded parallel data signal that is representative of each recorded binary bit read from and output by the storage device, the decoded parallel data signal including distinguishing indicia distinguishing formatting information from user information; and control and transfer means, responsive to unique formatting sequences within said serial bit-stream of binary data, for detecting the boundaries of predetermined groupings of bits in the serial bit-stream of binary data and for transferring to a host system, samples of the decoded parallel data signal corresponding to said predetermined groupings, said samples of the decoded parallel data being representative of each recorded binary bit read from and output by the storage device and thereby including both the user information and the formatting information contained in the series of recorded binary bits read from and output by the storage device.

5. A data transfer apparatus for transferring parallel data to a parallel-data receiving system wherein the transferred parallel data represents both user data and format data contained in a serial bit stream supplied from a serial bit stream source and wherein the format data of the serial bit stream includes unique bit sequences, said data transfer apparatus comprising:

(a) sequence detecting and decoding means, operatively coupled to the serial bit stream source, for detecting the unique bit sequences of said serial bit stream, for producing position indicating signals indicating the position within the serial bit-stream of the unique bit sequences, and for producing a decoded parallel data signal representative of both the user data and format data contained in said serial bit stream, wherein the decoded parallel data signal has distinguishing indicia for distinctly identifying portions of the decoded parallel data signal representing the format data from other portions of the decoded parallel data signal representing the user data information; and (b) transfer means, operatively coupled to receive the decoded parallel data signal produced by the sequence detecting and decoding means and responsive to the position indicating signals, for sampling the decoded parallel data signal and supplying the samplings of the decoded parallel data signal to the receiving system, wherein said sampling of the decoded parallel data signal is synchronized to the position indicating signals produced by the sequence detecting and decoding means.

6. A data transfer apparatus according to claim 5, further comprising:

(c) transfer control means, responsive to said position indicating signals and operatively coupled to the transfer means, for initiating the sampling of the decoded parallel data signal in synchronism with the position indicating signals.

7. A data transfer apparatus according to claim 6, wherein the transfer control means is responsive to the position indicating signals and the transfer control means includes:

trigger event detection means for detecting the occurrence of a predefined sequences of said position indicating signals and for initiating the sampling of the decoded parallel data signal upon the detection of the predefined sequence of position indicating signals.

8. A data transfer apparatus according to claim 6, wherein said data transfer apparatus is supported on a printed circuit board configured for installation into a bus expansion slot.

9. A data transfer apparatus according to claim 6, wherein the transfer means includes a data-storage buffer, an input end of the data-storage buffer being coupled to sample and collect the decoded parallel data signal produced by the sequence detection and decoding means, and an output end of the data-storage buffer being coupled to transfer said samplings of the decoded parallel data signal to the receiving system.

10. A data transfer apparatus according to claim 9, whererin the data-storage buffer is a first-in, first-out (FIFO) buffer.

11. A data transfer apparatus according to claim 10, wherein the transfer control means includes handshake means for coordinating the transfer of said samplings from the output end of the data-storage buffer to the receiving system in accordance with a predefined handshake protocol.

12. A data transfer apparatus according to claim 9,
wherein the transfer control means is operatively coupled to the output end of the data-storage buffer for detecting the occurrence of a predefined sequence of samplings of the decoded parallel data signal, and
wherein the transfer control means includes flag means for indicating to the receiving system that said predefined sequence of samplings has been detected.

13. A data transfer apparatus according to claim 12, wherein the transfer control means includes command receiving means, operatively coupled to the receiving system, for receiving instructions from the receiving system.

14. A data transfer apparatus according to claim 13, wherein the instructions received from the receiving system include an identification of a predefined sequence of samplings that the transfer control means is to detect and wherein the transfer control means operates in accordance with the received instruction.

15. A data transfer apparatus according to claim 13, wherein the instructions received from the receiving system include an identification of a predefined sequence of position indicating signals that the trigger event detection means is to detect and wherein the trigger event detection means operates in accordance with the received instruction.

* * * * *